United States Patent
Melanson et al.

(10) Patent No.: US 6,822,594 B1
(45) Date of Patent: Nov. 23, 2004

(54) OVERLOAD PROTECTION AND STABILITY FOR HIGH ORDER 1-BIT DELTA-SIGMA MODULATORS

(75) Inventors: John L. Melanson, Austin, TX (US); Kent B. Chambers, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/682,566

(22) Filed: Oct. 9, 2003

(51) Int. Cl.[7] ................................................ H03M 3/00
(52) U.S. Cl. ..................................... 341/143; 341/144
(58) Field of Search ................................. 341/143, 144, 341/118, 120, 155

(56) References Cited

U.S. PATENT DOCUMENTS

| | | | | |
|---|---|---|---|---|
| 5,055,843 A | * | 10/1991 | Ferguson, Jr. et al. | 341/143 |
| 5,424,739 A | * | 6/1995 | Norsworthy et al. | 341/143 |
| 5,585,801 A | * | 12/1996 | Thurston | 341/143 |
| 6,271,782 B1 | * | 8/2001 | Steensgaard-Madsen | 341/143 |
| 6,414,615 B1 | * | 7/2002 | Cheng | 341/143 |
| 6,462,685 B1 | * | 10/2002 | Korkala | 341/131 |
| 6,724,332 B1 | * | 4/2004 | Melanson | 341/143 |

OTHER PUBLICATIONS

Leuciuc, Adrian, "Nonlinear Stabilization Techniques for ΔΣ Modulators: A Comparison," Proceedings of 1999 European Conference on Circuit Theory and design ECCTD'99, Stresa, Italy, Aug. 29–Sep. 2, 1999, vol. 2, pp. 679–682.

* cited by examiner

Primary Examiner—Michael Tokar
Assistant Examiner—Linh Van Nguyen
(74) Attorney, Agent, or Firm—Hamilton & Terrile, LLP; Kent B. Chambers

(57) ABSTRACT

A combination of low order and high order filters and a rule-based 1-bit quantizer with multiple feedback paths and separate quantization output provide stabilization to a delta-sigma modulator during quantizer overload conditions. The 1-bit delta-sigma modulator system combines the superior in-band noise shaping properties of a high order delta-sigma modulator with the stability of a low order delta-sigma modulator to obtain a high order delta-sigma modulator with overload stability. The 1-bit quantizer operates in accordance with a set of primary quantization rules that enables high and low order delta-sigma modulators to work together and remain stable during overload conditions while minimizing performance degradation.

23 Claims, 2 Drawing Sheets

OVERLOAD PROTECTION AND STABILITY FOR HIGH ORDER 1-BIT DELTA-SIGMA MODULATORS

BACKGROUND OF THE INVENTION

1. Field of the Invention

The present invention relates in general to the field of signal processing, and more specifically to a system and method for providing overload protection and stability in high order, 1-bit delta-sigma modulators.

2. Description of the Related Art

Many signal processing systems, such as audio signal processing systems, utilize delta-sigma modulators to provide output data with a high, in-band signal to noise ratio. FIG. 1 depicts a conventional digital signal processing ("DSP") system 100 that includes a P-order digital loop filter 112 with a z-domain transfer function of L(z). DSP system 100 receives an R-bit digital input signal 104 from source 106. Source 106 can be any digital signal source, such as an analog-to-digital converter, a compact disk player and/or recorder system or a digital versatile disk (DVD) player and/or recorder. Digital input signal 104 often undergoes one or more preprocessing operations 108 prior to modulation by delta-sigma modulator 102. The type of pre-processing operation depends upon the purpose of DSP system 100. Example preprocessing operations are decimation and interpolation. Often preprocessing operation(s) 108 increase or decrease the sampling frequency of digital input signal 104 by a factor of "k". A summer 110 adds the now k-bit digital input signal 104 with the negative of output data q from delta-sigma modulator 102. The P-order digital loop filter processes the oversampled digital input signal 104 minus feedback signal q and generates an output signal u.

Delta-sigma modulator 102 represents a one-bit delta-sigma modulator. One-bit delta-sigma modulators provide a full-scale "high" or full scale "low" quantization output data q. The full-scale "high" and full-scale "low" are referred to herein as respective logical values +1 and −1. Thus, if the input signal, u, to the 1-bit quantizer 114 resides above a predetermined threshold level, q is +1. Output data q is otherwise −1. Output data q provides feedback to loop filter 112. Output data q is provided to one or more post-processing components 116. The output data q can be used directly by some digital recording components to directly encode digital media. In other embodiments, post-processing components include a digital-to-analog converter ("DAC"), such as a switched capacitor filter, to process groups of M output signals q to reconstruct the digital input signal 104 into an analog waveform. Post-processing components 116 can also include an analog low pass filter to filter out out-of-band noise and provide the filtered output signal to a load, such as a speaker system. "Delta-sigma modulators" are also commonly referred to using other interchangeable terms such as "sigma-delta modulators", "delta-sigma converters", "sigma delta converters", and "noise shapers".

Many DSP systems utilize delta-sigma modulators because of their noise shaping capabilities. The delta-sigma modulator 102 shapes the noise frequency components of digital input signal 106 so that nearly all the noise energy lies out-of-band, i.e. outside a bandwidth of interest. In an audio system, the bandwidth of interest typically lies within the range of 0–25 kHz. P-order loop filter 112 is well-known to those of ordinary skill in the art and includes P integration stages. In general, higher order delta-sigma modulators provide better in-band noise shaping characteristics by shifting more noise energy to frequencies outside the bandwidth of interest. The inherently coarse quantization of 1-bit delta-sigma modulators results in a higher noise floor. Because of the better in-band noise shaping characteristics of higher order loop filters, 1-bit delta-sigma modulators often include at least a third order loop filter. Third order and higher order delta-sigma modulators are referred to herein as "high order" delta-sigma modulators.

Stability is a primary concern in the design and operation of delta-sigma modulators. "Instability" of a delta-sigma modulator means that the delta-sigma modulator exhibits large, bounded (or unbounded) states and poor signal to noise ratios, especially as compared with predictions by linear models. Stability in high order delta-sigma modulators is even more challenging than $1^{st}$ and $2^{nd}$ order delta-sigma modulators because the analytical complexities of high order delta-sigma modulators in actual operational environments have defied conventional attempts to develop accurate instability prediction mechanisms. Thus, although empirical evidence can be obtained to suggest stability for high order delta-sigma systems over a variety of operational regions, stability cannot be guaranteed for all possible input signals.

Many causes for instability exist with high order delta-sigma modulators. One such cause is quantizer overload. Quantizer overload generally occurs when a quantizer receives input data that is either excessively high or low. Higher order delta-sigma modulator systems exhibit an increasingly lower tolerance to input signals that approach reference levels (i.e. output limits) of the quantizer. For example, an input signal as small as one-half of a reference level can cause a sixth order delta-sigma modulator to overload. Quantizer overload conditions can cause instability via a number of mechanisms including nonlinear feedback to the high order loop filter, large quantization noise, and low signal gain. For example, if quantizer 114 has a limited range of output signals, such as signals between reference levels of +/−5. An input signal outside the range will cause the quantizer 114 to unsuccessfully attempt to track the output signal. Signals can be unintentionally outside the range due to a variety of well-known reasons including the Gibbs phenomenon overshoot that occurs when a discontinuity exists between input samples. Even when the input signal falls within the range of quantizer 102 but lies near the range boundary, the quantizer 102 could overload. The output signal of delta-sigma modulator 102 can generally be approximated by a probability density function having an approximately Gaussian distribution. Thus, although the input signal 104 to the delta-sigma modulator 102 may originally lie within a non-overload range, the input signal u to the 1-bit quantizer 114 may exceed the non-overload range. Accordingly, quantizer overload conditions can exist when a probability of quantizer overload exists. Such error can be attributed to a number of sources such as internal noise and other system perturbations. Thus, if the delta-sigma modulator 102 receives an input signal of +4.9, a probability that the DS modulator will attempt to provide a series of output signals q representative of an output >+5 exists. Such an output can cause nonlinear feedback to the loop filter. For a P-order delta-sigma modulator, the greater P is the less tolerance delta-sigma modulator 102 has for input signals close to the reference levels.

Instability of delta-sigma modulators causes many undesirable effects. In audio systems, instability can cause oscillations resulting in undesirable, audible tones. Instability can also cause abrupt signal magnitude and frequency changes, which also result in undesirable noise.

Many techniques exist for handling quantizer overload conditions. A limiter can be used to confine the input signal to a no-overload region through clipping operations in analog systems or through bit truncations in discrete systems. Other techniques rely on complicated designs, which can require a significant amount of design time, chip real estate, and implementation difficulties. However, despite an enormous amount of effort, due to the analytical complexities of high order delta-sigma modulators, accurate instability prediction mechanisms have yet to be developed.

SUMMARY OF THE INVENTION

In one embodiment of the present invention, a delta-sigma modulation system includes an M-order filter to process input data, wherein M is greater than or equal to 3. The delta-sigma modulation system further includes an N-order filter, wherein N has a value that provides stability to the delta-sigma modulator during overload conditions. The delta-sigma modulation system further includes a quantizer system coupled to the M-order and N-order filters to receive input data from the M-order and N-order filters, provide quantized feedback data, $q_M$, to the M-order filter, provide quantized feedback data, $q_N$, to the N-order filter, and provide 1-bit quantization output data q, wherein $q=q_M+q_N$.

In another embodiment of the present invention, digital signal processing system having a delta-sigma modulator with stability protection during quantizer overload conditions. The system includes an M-order loop filter to process a sum of input data and feedback data, $q_M$, wherein M is more than two, and includes an N-order loop filter to process feedback data, $q_N$, wherein N is selected from the group consisting of one and two. The system further includes a rules based 1-bit quantizer to process output data from the N-order loop filter and M-order filter and to provide $q_M$, $q_N$, and 1-bit quantized output data, q, wherein $q=q_M+q_N$, and $q_{Mmax}$ is greater than the maximum value of q and $q_{Mmin}$ is less than the minimum value of q to maintain stability of the M-order loop filter during overload conditions.

In another embodiment of the present invention, a digital signal processing system includes an M-order filter to process input data, wherein M is greater than 2 and an N-order filter that is stable during overload conditions. The system further includes a quantizer system coupled to the M-order and N-order filters to receive input data from the M-order and N-order filters, provide quantized feedback data to the M-order filter, provide quantized feedback data to the N-order filter, and provide two state quantization output data, wherein the quantization output data approximately equals the feedback data to the M-order filter plus the feedback data to the N-order filter.

In another embodiment of the present invention, a method of maintaining stability of a 1-bit delta-sigma modulation system under overload conditions includes quantizing output data of an M-order filter, wherein M is greater than or equal to 3. The method further includes quantizing output data of an N-order filter, providing feedback data, $q_M$, to the N-order filter, providing feedback data $q_N$ to the N-order filter, and providing 1-bit quantization output data, q, wherein q equals $q_N+q_M$.

In another embodiment of the present invention, a method of maintaining stability of a 1-bit delta-sigma modulator during overload conditions, wherein the 1-bit delta-sigma modulator comprises a quantizer, an M-order loop filter, and an N-order loop filter includes providing 1-bit output data, q, based on input data from an M-order loop filter and an N-order loop filter, wherein M is greater than or equal to three and N is selected to provide stability to the delta-sigma modulator during overload conditions. The method further includes detecting an overload condition of a quantizer and providing appropriate feedback data, $q_M$, for the M-order loop filter to enable the M-order loop filter to remain stable during the overload conditions, wherein a maximum value of feedback data $q_M$ is greater than the maximum value of output data q. The method also includes providing compensating feedback data, $q_N$, for the N-order loop filter to maintain an acceptable gain level of the quantizer.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Although the present invention has been described in detail, it should be understood that various changes, substitutions and alterations can be made hereto without departing from the spirit and scope of the invention as defined by the appended claims.

A combination of low order and high order filters and a rule-based 1-bit quantizer with multiple feedback paths and separate quantization output provide stabilization to a delta-sigma modulator during quantizer overload conditions. The conditions for quantizer overload occur when a delta-sigma modulator quantizer receives excessively high or low input data. Quantizer overload conditions can cause the delta-sigma modulator to provide output data with excessive quantization noise and/or nonlinear feedback. Excessive quantization noise and, thus, low signal gain can cause high order delta-sigma modulator to become unstable. Contrary to high order delta-sigma modulator systems, low order (i.e. first or second order) delta-sigma modulators can be designed with certainty to remain stable during quantizer overload conditions. The 1-bit delta-sigma modulator system 200 combines the superior noise shaping properties of a high order delta-sigma modulator with the stability of a low order delta-sigma modulator to obtain a high order delta-sigma modulator with overload stability. A 1-bit quantizer operates in accordance with a set of primary quantization rules that enables high and low order delta-sigma modulators to work together and remain stable during overload conditions while minimizing performance degradation.

Figure 1:
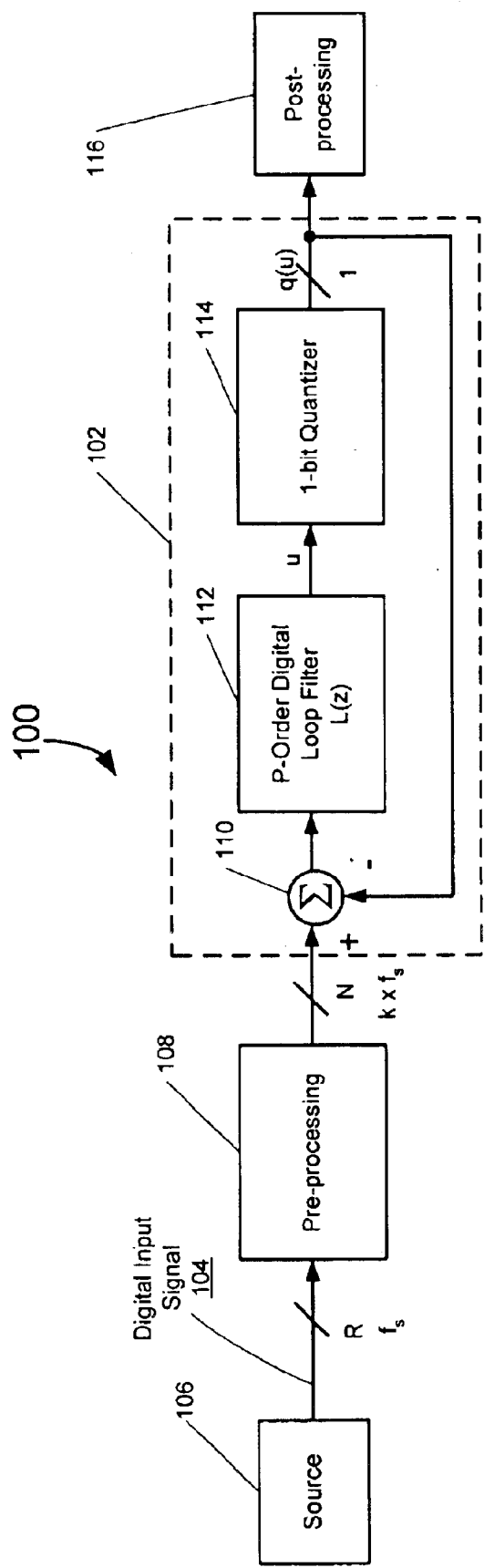
FIG. 1 depicts a digital signal processing system that includes a P-order digital loop filter and a 1-bit quantizer according to the prior art.
Figure 2:
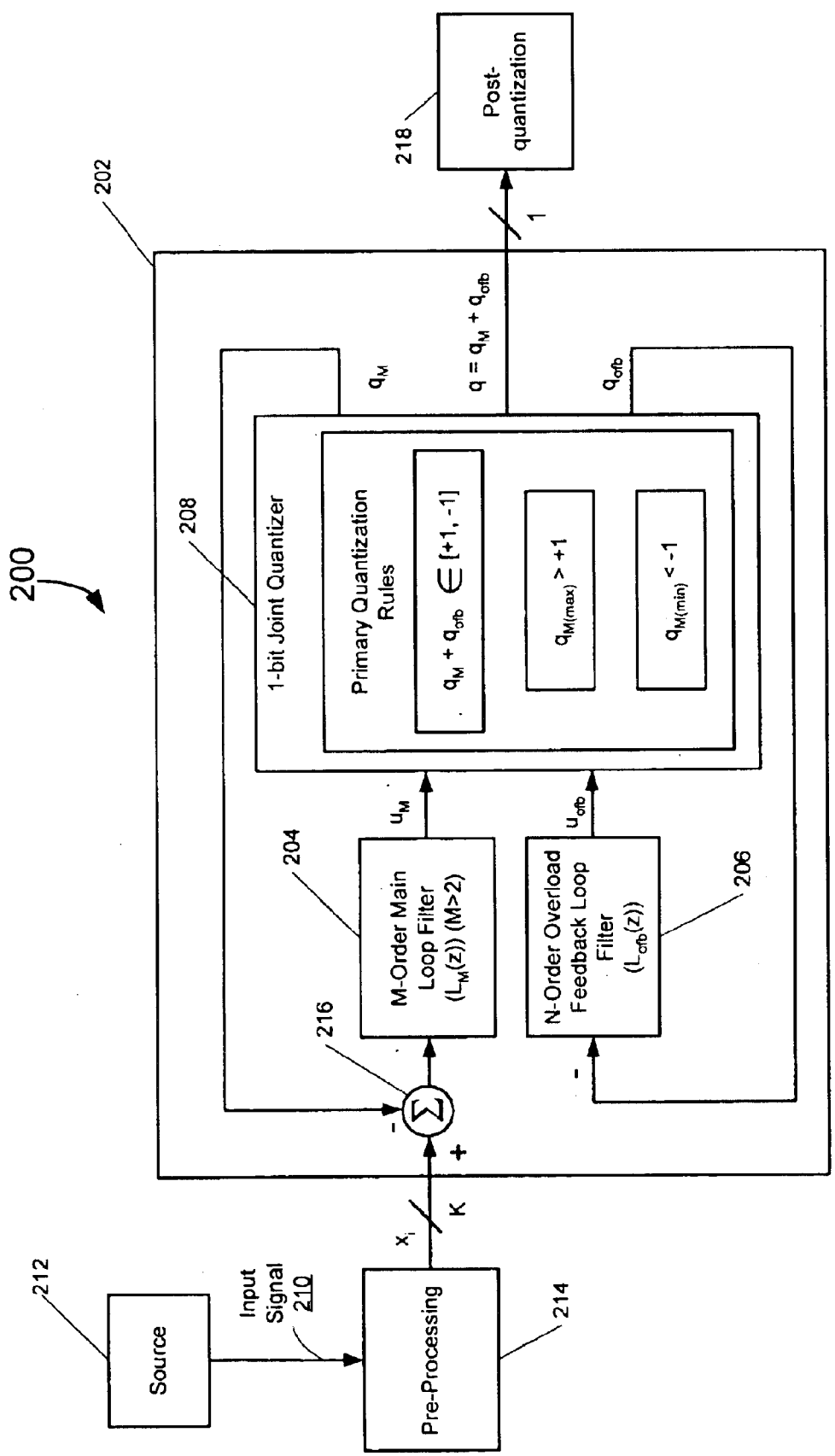
FIG. 2 depicts a digital signal processing system that includes a high order, overload stabilized delta-sigma modulator with dual quantizer output feedback, a combination of low order and high order filters, and a 1-bit quantizer output

Referring to FIG. 2, the delta-sigma modulator 202 of digital signal processing (DSP) system 200 represents one embodiment of a combination high order/low order delta-sigma modulator system. The main loop filter 204 of delta-sigma modulator 202 is a high order conventional loop filter having a Z domain transfer function of $L_M(z)$ and an order of M. The delta-sigma modulator 202 also includes a conventional low order, overload feedback loop filter 206 having a Z domain transfer function of $L_{ofb}(z)$ and an order of N. The particular order of main loop filter 204 is chosen to provide the desired noise shaping characteristics of delta-sigma modulator 202 under normal operating conditions. Thus, M is generally greater than or equal to three. The order of overload feedback loop filter 206 is chosen to provide stability during quantizer overload conditions. Since quantizer overload stability can be assured of using a first order or second order loop. filter, N is generally one or two and preferably two. The main loop filter 204 provides data $u_M$ to quantizer 208, and overload feedback loop filter 206 provides data $u_{ofb}$ to quantizer 208.

Quantizer 208 processes input data $u_M$ and $u_{ofb}$ in accordance with a set of quantization rules to generate quantization feedback data $q_M$ and $q_{ofb}$ as well as output data q. Output data q equals the sum of $q_M$ and $q_{ofb}$ and is either a logical +1 or a logical −1 in accordance with conventional output criteria of a 1-bit delta-sigma modulator. During overload conditions, feedback data $q_M$ is chosen so as to provide adequate feedback to main loop filter 204 to allow main loop filter 204 to remain stable. Conventional delta-sigma modulators only provide feedback of +1 or −1 to the main loop filter. However, a feedback level greater than +1 or less than −1 can be required to ensure stability. Quantizer 208 can provide greater than +1 and less than −1 output data feedback $q_M$ to ensure stability of main loop filter 204 during overload conditions. During overload conditions, feedback data $q_{ofb}$ is chosen to offset the excessive feedback data $q_M$ so as to provide continuous quantizer 208 operation with minimum error in reproducing input signal 210. Feedback data $q_{ofb}$ provides negative feedback. The primary quantization rules of quantizer 208 are set forth in Table 1:

TABLE 1

Primary Quantization Rules (1) $q = q_M + q_{ofb}$;
(2) $q \in [+1, -1]$;
(3) $q_{Mmax} > +1$;
(4) $q_{Mmin} < -1$;

Virtually any quantizer feedback step sizes and number of steps can be used to maintain stability of a high order 1-bit delta-sigma modulator and minimize performance degradation during overload conditions. For a 1-bit quantizer, the step size between successive levels of feedback data $q_M$ and $q_{ofb}$ and number of steps are a matter of design choice so long as quantizer complies with the primary quantization rules depicted in Table 1.

During overload conditions, quantizer 208 provides feedback data to the high order main filter outside the maximum and minimum range of output data provided by quantizer 208, and quantizer 208 provides compensating feedback data to a stabilized filter. In general, during quantizer overload conditions, $q_{Mmax}$ and $q_{Mmin}$ should be as close to +1 and −1, respectively, as possible to minimize performance degradation of delta-sigma modulator 202. Because quantizer 208 provides compensating feedback data to a stabilized filter, non-integer feedback step sizes can be used to provide feedback data to main loop filter 204 and overload feedback loop filter 206. Thus, the particular values of $q_{Mmax}$ and $q_{Mmin}$ and all intermediate values of $q_M$ can be integers or non-integers. Non-integer feedback data step sizes can require additional circuitry and/or processor operations to perform summation and integration computations. References to "+1" and "−1" represent typical nomenclature for the relative output states of a two state quantizer and represent all actual two state output levels. Actual output levels may have any value appropriate to the quantizer. References to "1-bit" refer to two-states, e.g. a "1-bit quantizer" is a two state quantizer.

Quantizer 208 operates in accordance with a set of rules to determine q, $q_M$, and $q_{ofb}$. Table 2 depicts one embodiment of a full representation of the rules used by quantizer 208 to determine quantizer output data q, main loop filter 204 feedback data $q_M$, and overload feedback loop filter 206 feedback data $q_{ofb}$. The variable "overlim" in Table 2 is preferably set to a value small enough to facilitate stability under quantizer overload conditions and large enough to not be exceeded during normal, i.e. non-overload, operation. If "+overlim" is set too small and/or "−overlim" is set too large, overload feedback loop filter 206 will be used during times when no quantizer overload condition exists. If "+overlim" is set too large and/or "−overlim" is set too small, feedback data $q_M$ can cause main loop filter 204 to become unstable. The variable "overlim" can be determined empirically.

Using overload feedback loop filter 206 lowers the signal-to-noise ("SNR") ratio of the output data of DSP system 200. A high order loop filter can achieve an SNR in the range of +120 dB. A second order loop filter can achieve an SNR in the range of +80 dB. Thus, it is preferable during non-overload conditions to provide most or all of the energy represented by input data $x_i$ to main loop filter 204. However, during overload conditions, through the use of feedback data $q_M$ and qofb, quantizer 202 diverts much of the energy of input data $x_i$ to overload feedback loop filter 206. This diversion generally results in an SNR in the range of +90 dB. However, the transition can be relatively smooth that results in a barely perceptible signal degradation. The lowering of the SNR of the output signal is even less perceptible in audio systems due to the fact that most of the audible noise is located at higher frequencies, and human ears are less sensitive to higher frequencies. For example, during overload conditions, the input signal to overload feedback loop filter 206 represents most of the energy of digital input signal $x_i$ In Table 2, "+overlim" is set to +1.5 and "−overlim" is set to −1.5. For (i) a sixth order main loop filter 204, (ii) a second order overload feedback loop filter 206, and (iii) a quantizer gain of 1, quantizer 108 produces a maximum feedback $q_M$ ("$q_{Mmax}$") of +2 and a minimum feedback of $q_M$ ("$q_{Mmin}$") of −2.

TABLE 2

| $u_M$ | $u_{ofb}$ | $q_M$ | $q_{ofb}$ | q |
|---|---|---|---|---|
| $u_M$ > +overlim | X* | +2 | −1 | +1 |
| 0 < $u_M$ ≤ +overlim | ≧0 | +1 | 0 | +1 |
| 0 < $u_M$ ≤ +overlim | −1 | 0 | −1 | −1 |
| 0 < $u_M$ ≤ +overlim | <−1 | +1 | −2 | −1 |
| −overlim < $u_M$ ≤ 0 | >+1 | −1 | 0 | +1 |
| −overlim < $u_M$ ≤ 0 | +1 | 0 | +1 | +1 |
| −overlim < $u_M$ ≤ 0 | ≦0 | −1 | +2 | −1 |
| $u_M$ < −overlim | X | −2 | +1 | −1 |

*don't care state.

The quantizer 208 can be implemented using software and a processor, such as a general purpose processor or specialized digital signal processor. The following pseudocode using C-compiler operator symbology can be used to generate the feedback data $q_M$ and $q_{ofb}$ for a second order overload feedback loop filter 206:

```
q=U_M>0?1:-1;q_ofb=0;
if(u_M > +overlim) {
    q_M =2;q_ofb =-1;
}else if(u_M < -overlim){
    q_M=-2;q_ofb=1;
}else if (u_ofb > 0 && u_M = =-1){
    if (u_ofb= =1) {
        q_M=0;q_ofb=1;
    }else{
        q_M=1;q_ofb = 2;
    }
}else if (u_ofb < 0 && u_M= =+1){
    if(u_ofb= =-1){
        q_M=0;q_ofb= -1;
    }else{
        q_M=1;q_ofb = -2;
    }
}
/* implement a second order overload protected feedback loop filter
206. "oi0" is a 5 bit output of a first stage integrator of the loop filter
206, and u_ofb is a 7 bit output of a second stage integrator of the loop
filter 206. */
oi0=oi0-u_ofb; if (oi0>15)oi0=15;if(oi0<-6)oi0=-16;
u_ofb=u_ofb+oi0-q_ofb;if(u_ofb>63)u_ofb=63;if(u_ofb<-64)u_ofb=-64;
```

Any DSP system that utilizes a delta-sigma modulator can use the delta-sigma modulator 202 as a component. The DSP system 200 illustrates one embodiment of a DSP system such as audio and video systems. DSP system 200 is particularly useful for providing data for digital recording systems. Source 212 provides input signal 210 to pre-processing component 214. The source 212 can be any digital or analog source, such as a compact disk player and/or recorder system or a digital versatile disk (DVD) player and/or recorder. For digital recording systems, pre-processing component 214 can include a decimation filter to produce K-bit signal $x_i$. In another embodiment, pre-processing component 214 can include an interpolation filter to oversample input signal 210 to produce K-bit digital signal $x_i$. Delta-sigma modulator 202 sums digital input signal $x_i$ with feedback data $q_M$ (as represented by summer 216) to generate an input signal to main loop filter 204. The 1-bit output data, q, of delta-sigma modulator 202 provides input data to post-quantization component(s) 218. For digital recording systems, post-quantization component(s) 218 encodes a digital recording media using the output data q. In another embodiment, post-quantization component(s) 218 includes an analog low pass filter to filter out out-of-band noise and provides an analog output signal to a load, such as a speaker system.

The DSP 200 and the delta-sigma modulator 202 in particular can be implemented using analog and/or digital hardware components. Furthermore, DSP system 200 and the delta-sigma modulator 202 in particular can also be implemented using software and/or firmware.

Although the present invention has been described in detail, it should be understood that various changes, substitutions and alterations can be made hereto without departing from the spirit and scope of the invention as defined by the appended claims.

What is claimed is:

1. A delta-sigma modulation system comprising:
   an M-order filter to process input data, wherein M is greater than or equal to 3;
   an N-order filter that is stable during overload conditions; and
   a quantizer system coupled to the M-order and N-order filters to receive input data from the M-order and N-order filters, provide quantized feedback data, $q_M$, to the M-order filter, provide quantized feedback data, $q_N$, to the N-order filter, and provide two state quantization output data q, wherein $q=q_M+q_N$.

2. The delta-sigma modulation system of claim 1 wherein a maximum value of feedback data $q_M$ is greater than a maximum value of output data q, and a minimum value of feedback data $q_M$ is less than a minimum value of output data q.

3. The delta-sigma modulation system of claim 1 wherein q is an element of the logical value set, a maximum value of feedback data $q_M$ is greater than +1, and a minimum value of feedback data $q_M$ is less than −1.

4. The delta-sigma modulation system of claim 3 wherein feedback data $q_M$ and $q_N$ are integers.

5. The delta-sigma modulation system of claim 3 wherein feedback data $q_M$ and $q_N$ are real numbers including non-integers.

6. The delta-sigma modulation system of claim 1 wherein N equals 2.

7. The delta-sigma modulation system of claim 1 further wherein the input signal is a decimated version of a digital audio signal.

8. The delta-sigma modulation system of claim 1 wherein the input signal is a digital input signal.

9. A digital signal processing system having a delta-sigma modulator with stability protection during quantizer overload conditions, the system comprising:
   an M-order loop filter to process a sum of input data and feedback data, $q_M$, wherein M is more than two;
   an N-order loop filter to process feedback data, $q_N$, wherein N is selected from the group consisting of one and two;
   a rules based 1-bit quantizer to process output data from the N-order loop filter and M-order filter and to provide $q_M$, $q_N$, and 1-bit quantized output data, q, wherein $q=q_M+q_N$, and $q_{Mmax}$ is greater than the maximum value of q and $q_{Mmin}$ is less than the minimum value of q to maintain stability of the M-order loop filter during overload conditions.

10. The digital signal processing system of claim 9 wherein overload conditions include conditions wherein a significant probability exists that input data to the quantizer will cause the M-order filter to become unstable if $q_M$ does not exceed the maximum range of q.

11. A digital signal processing system comprising:
   an M-order filter to process input data, wherein M is greater than 2;
   an N-order filter that is stable during overload conditions; and
   a quantizer system coupled to the M-order and N-order filters to receive input data from the M-order and N-order filters, provide quantized feedback data to the M-order filter, provide quantized feedback data to the N-order filter, and provide two state quantization output data, wherein the quantization output data approximately equals the feedback data to the M-order filter plus the feedback data to the N-order filter.

12. The digital signal processing system of claim 11 wherein a maximum value of feedback data is greater than a maximum value of output data, and a minimum value of feedback data is less than a minimum value of output data.

13. A method of maintaining stability of a 1-bit delta-sigma modulation system under overload conditions, the method comprising:
   providing quantized output data using output data of an M-order filter and output data of an N-order filter, wherein M is greater than or equal to 3 and the N-order filter is stable under overload conditions;

providing feedback data, $q_M$, to the M-order filter;

providing feedback data $q_N$ to the N-order filter; and providing 1-bit quantization output data, q, wherein q equals $q_N+q_M$.

14. The method of claim 13 wherein a maximum value of feedback data $q_M$ is greater than a maximum value of output data q, and a minimum value of feedback data $q_M$ is less than a minimum value of output data q.

15. The method of claim 14 wherein feedback data $q_M$ and $q_N$ are integers.

16. The method of claim 14 wherein feedback data $q_M$ and $q_N$ are real numbers including non-integers.

17. The method of claim 13 wherein q is an element of the logical value set, a maximum value of feedback data $q_M$ is greater than +1, and a minimum value of feedback data $q_M$ is less than −1.

18. The method of claim 13 wherein N equals 2.

19. The method of claim 13 further wherein the input signal is an oversampled version of a digital audio signal.

20. The method of claim 13 further comprising:

receiving a digital input signal;

providing the digital input signal to the N-order filter; and converting the 1-bit quantization output data into encoded audio data.

21. A method of maintaining stability of a 1-bit delta-sigma modulator during overload conditions, wherein the 1-bit delta-sigma modulator comprises a quantizer, an M-order loop filter, and an N-order loop filter, the method comprising:

providing 1-bit output data, q, based on input data from an M-order loop filter and an N-order loop filter, wherein M is greater than or equal to three and N is selected to provide stability to the delta-sigma modulator during overload conditions;

detecting an overload condition of a quantizer;

providing appropriate feedback data, $q_M$, for the M-order loop filter to enable the M-order loop filter to remain stable during the overload conditions, wherein a maximum value of feedback data $q_M$ is greater than the maximum value of output data q; and providing compensating feedback data, $q_N$, for the N-order loop filter to maintain an acceptable gain level of the quantizer.

22. The method of claim 21 further comprising: determining $q_M$ and $q_N$ using a predetermined set of rules.

23. The method of claim 21 wherein $q=q_M+q_N$.

* * * * *